(12) United States Patent
Larsen (10) Patent No.: US 6,839,217 B1
(45) Date of Patent: Jan. 4, 2005

(54) SURFACE STRUCTURE AND METHOD OF MAKING, AND ELECTROSTATIC WAFER CLAMP INCORPORATING SURFACE STRUCTURE

(75) Inventor: Grant Kenji Larsen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 09/676,548

(22) Filed: Sep. 29, 2000

Related U.S. Application Data (60) Provisional application No. 60/233,039, filed on Sep. 15, 2000, and provisional application No. 60/157,398, filed on Oct. 1, 1999.

(51) Int. Cl.$^7$ .............................................. H01H 47/00
(52) U.S. Cl. ........................................ 361/234; 361/233
(58) Field of Search ................................. 361/233, 234

(56) References Cited

U.S. PATENT DOCUMENTS

| | | | |
|---|---|---|---|
| 4,139,051 A | 2/1979 | Jones et al. | |
| 4,184,188 A | 1/1980 | Briglia | 361/234 |
| 4,282,924 A | 8/1981 | Faretra | |
| 4,457,359 A | 7/1984 | Holden | 165/800 |
| 4,480,284 A | 10/1984 | Tojo et al. | 361/234 |
| 4,535,835 A | 8/1985 | Holden | |
| 4,645,218 A | 2/1987 | Ooshio et al. | 279/1 M |
| 4,832,781 A | 5/1989 | Mears | 156/345 |
| 4,938,992 A | 7/1990 | Mears | 427/38 |
| 5,103,367 A | 4/1992 | Horwitz et al. | 361/234 |
| 5,345,999 A | 9/1994 | Hosokawa | 165/80.2 |
| 5,384,682 A | 1/1995 | Watanabe et al. | 361/234 |
| 5,452,177 A | 9/1995 | Frutiger | 361/234 |
| 5,528,451 A | 6/1996 | Su | 361/234 |
| 5,560,780 A | 10/1996 | Wu et al. | 118/728 |
| 5,583,736 A | 12/1996 | Anderson | 361/234 |
| 5,606,485 A | 2/1997 | Shamouilian et al. | 361/234 |
| 5,631,803 A | 5/1997 | Cameron et al. | 361/234 |
| 5,634,266 A | 6/1997 | Sherstinsky et al. | 29/825 |
| 5,636,098 A | 6/1997 | Salfelder | 361/234 |
| 5,644,467 A | 7/1997 | Steger et al. | 361/234 |
| 5,777,838 A | 7/1998 | Tamagawa et al. | |
| 5,812,362 A | 9/1998 | Ravi | 361/234 |
| 5,822,171 A | 10/1998 | Shamouilian et al. | |
| 5,969,934 A | 10/1999 | Larsen | 361/234 |
| 6,362,946 B1 * | 3/2002 | Larsen | 361/234 |

FOREIGN PATENT DOCUMENTS

| | | |
|---|---|---|
| EP | 0 323 902 A2 | 7/1989 |
| EP | 0 780 885 A2 | 6/1997 |

* cited by examiner

*Primary Examiner*—Stephen W. Jackson (57) ABSTRACT

A surface structure for contacting a workpiece includes a flexible layer adhered to a support element and a coating on the flexible layer. The coating has ripples on its surface. The flexible layer may be thermally conductive. The ripples on the surface enhance thermal transfer from the workpiece and are characterized by low particle generation and low particulate contamination of the workpiece. The ripples in the coating may be formed by expanding the flexible layer, applying the coating to the expanded flexible layer and then contracting the flexible layer. In one application, the surface structure is utilized in an electrostatic wafer clamp. The surface structure provides high efficiency thermal transfer in a vacuum processing system when utilized in conjunction with a low pressure cooling gas between the workpiece and the surface structure.

36 Claims, 8 Drawing Sheets

SURFACE STRUCTURE AND METHOD OF MAKING, AND ELECTROSTATIC WAFER CLAMP INCORPORATING SURFACE STRUCTURE

CROSS REFERENCE TO RELATED APPLICATIONS

This application claims the benefit of provisional application Ser. No. 60/157,398 filed Oct. 1, 1999 and provisional application Ser. No. 60/233,039 filed Sep. 15, 2000.

FIELD OF THE INVENTION

This invention relates to surface structures for contacting a workpiece and to methods for making the surface structures and, more particularly, to surface structures for contacting semiconductor wafers in a vacuum processing chamber. The surface structures are characterized by highly efficient thermal transfer and low particulate contamination. The surface structures are particularly useful in electrostatic wafer clamps used in ion implantation systems, but are not limited to such use.

BACKGROUND OF THE INVENTION

In the fabrication of integrated circuits, a number of well established processes involve the application of ion beams to semiconductor wafers in vacuum. These processes include, for example, ion implantation, ion beam milling and reactive ion etching. In each instance, a beam of ions is generated in a source and is accelerated toward a target wafer.

Ion implantation has become a standard technique for introducing dopant materials into semiconductor wafers. A desired dopant material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

The target mounting site is a critical component of an ion implantation system or other ion beam system. The target mounting site is required to firmly clamp a semiconductor wafer to a platen for ion implantation and, in most cases, to provide cooling of the wafer. In addition, a wafer handling system is provided for loading wafers onto the target mounting site and for removing the wafers after completion of ion implantation.

Cooling of wafers is particularly important in commercial semiconductor processing wherein a major objective is to achieve a high throughput in terms of wafers processed per unit time. One way to achieve high throughput is to use a high current ion beam so that the implantation process is completed in a relatively short time. However, large amounts of heat are likely to be generated by the high current ion beam. The heat can result in uncontrolled diffusion of impurities beyond described limits in the wafer and in degradation of patterned photoresist layers. It is usually necessary to provide wafer cooling in order to limit the maximum wafer temperature to about 100° C.

A number of techniques for clamping a semiconductor wafer at the target mounting site are known in the art. According to one well-known technique, the wafer is clamped against a platen by a peripheral clamping ring which engages the outer periphery of the front surface of the wafer. The front surface of the wafer, with the exception of the area blocked by the clamping ring, is exposed for ion implantation.

A wafer clamping technique which eliminates the requirement for a peripheral clamping ring and which permits the use of a flat platen surface is centrifugal clamping. In centrifugal clamping, the wafer mounting site is rotated about an axis of rotation. The platen surface is oriented at an angle with respect to the axis of rotation so that centrifugal force presses the wafer against the platen surface. However, the requirement for rotating the wafer mounting site in order to provide centrifugal clamping adds complexity and is not always practical.

Another known technique for clamping semiconductor wafers involves the use of electrostatic forces. A dielectric layer is positioned between a semiconductor wafer and a conductive support plate. A voltage is applied between the semiconductor wafer and the support plate, and the wafer is clamped against the dielectric layer by electrostatic forces. Electrostatic wafer clamps are disclosed, for example, in U.S. Pat. No. 5,452,177 issued Sep. 19, 1995 to Frutiger and U.S. Pat. No. 5,969,934 issued Oct. 19, 1999 to Larsen.

Regardless of the clamping technique utilized, thermal transfer from a semiconductor wafer to a heat sink in vacuum is problematic. Heat transfer by radiation from the wafer is inadequate, except for low current ion beams. Even where the wafer is in physical contact with the platen surface, surface irregularities on the wafer and the platen surface limit actual contact to about 5% of the two surface areas and thereby limit solid-to-solid thermal conduction.

A variety of techniques have been disclosed for ensuring a high rate of thermal transfer from the wafer to a platen or heat sink. A contoured heat sink for optimizing conductive heat transfer between a wafer and a heat sink is disclosed in U.S. Pat. No. 4,535,835 issued Aug. 20, 1985 to Holden. The heat sink surface is contoured to impose a load that results in a uniform contact pressure distribution and a stress approaching the elastic limit of the wafer for a peripherally clamped wafer.

Another prior art technique for thermal transfer in vacuum involves the use of a thermally conductive polymer between a semiconductor wafer and a heat sink. A tacky, inert polymer film for providing thermal contact between a wafer and a heat sink is disclosed in U.S. Pat. No. 4,139,051 issued Feb. 13, 1979 to Jones et al. An automated wafer clamping mechanism utilizing a pliable, thermally-conductive layer between a semiconductor wafer and a heat sink is disclosed in U.S. Pat. No. 4,282,924 issued Aug. 11, 1981 to Faretra. The wafer is clamped at its periphery to a convexly curved platen having a layer of thermally-conductive silicone rubber on its surface. A thermal transfer technique which utilizes centrifugal clamping and a flat platen surface having a pliable, thermally-conductive polymer layer for effective thermal transfer is disclosed in U.S. Pat. No. 4,832,781 issued May 23, 1989 to Mears.

Prior art silicone rubber layers have been relatively thick. A disadvantage is that such materials are not inherently heat conductive. This can be compensated for by doping the material with heat conductive particles and/or by applying pressure to the wafer such that the number of contact points increases to compensate for the limited heat transfer at each point. The doping method has the disadvantage of adding an extra process step and the possibility of particle or elemental contamination by the heat conductive particles. The increased pressure method has the disadvantage that the increased pressure may induce wafer breakage, coupled with the difficulties of applying such pressure to the wafer. When the pressure is applied to the wafer edge, as with a mechanical clamp ring, the pressure at the center of the wafer is limited by wafer flexure. When the pressure is applied across the wafer, as with an electrostatic clamp, the disadvantages are the cost and difficulty of manufacturing a sufficiently powerful clamp, as well as the use of high voltages to achieve a given cooling capacity. In either method, the use of the flexible material, which is usually organic, gives rise to organic contamination, known to be detrimental in wafer processing.

The technique of gas conduction has also been utilized for wafer cooling in vacuum. Gas is introduced into a cavity or microscopic voids behind a semiconductor wafer and effects thermal coupling between the wafer and the heat sink. Gas-assisted, solid-to-solid thermal transfer with a semiconductor wafer is disclosed in U.S. Pat. No. 4,457,359 issued Jul. 3, 1984 to Holden.

The gas conduction technique has the disadvantage that the heat sink surface must be strictly controlled dimensionally to match the characteristic distances of molecular travel at the pressures of the cooling gases used. Further, leakage of the cooling gas is a problem, resulting in non-uniform cooling, and possible degradation of the process by localized gas concentrations at the leakage areas. For a given cooling capacity, the gas pressure may flex the wafer, again possibly degrading the integrity of the process.

As semiconductor device geometries become progressively smaller and wafer sizes become progressively larger, the allowable particulate contamination specifications become more restrictive. The particulate performance of wafer clamping mechanisms is of particular concern because the wafers physically contact the clamping surface. In the case of electrostatic wafer clamps, the electrostatic forces which are employed to clamp wafers also attract particles.

Accordingly, it is desirable to provide surface structures for contacting a workpiece which are characterized by low particle generation and low particulate contamination of the workpiece and which may be characterized by efficient thermal transfer from the workpiece.

SUMMARY OF THE INVENTION

According to one aspect of the invention, a surface structure for contacting a workpiece is provided. The surface structure comprises a flexible layer adhered to a support element, and a coating on the flexible layer. The coating has ripples on its surface. The workpiece may be a semiconductor wafer.

The ripples may form a pattern in the surface of the coating and typically form a regular pattern in localized areas of the coating surface. Preferably, the wavelength of the ripples is equal to or less than the mean free path of a gas introduced between the coating and the workpiece. However, the wavelength of the ripples may be greater than the mean free path of the gas when the amplitude of the ripples is equal to or less than the mean free path of the gas. The ripples may have any shape and length. In particular, the ripples may be elongated in one dimension, thus defining a series of parallel but not necessarily straight channels, or may be relatively short, thus defining a multiplicity of nodules or bumps on the surface.

The coating may comprise a ceramic or other inert inorganic material with good structural integrity and good shear strength, and the flexible layer may comprise a polymer layer. In one embodiment, the flexible layer is silicone rubber having a thickness in a range of about 5 to 10 micrometers, and the coating is silicon nitride, silicon carbonitride, silicon dioxide or carbon having a thickness in a range of about 0.25 to 0.50 micrometer. This embodiment exhibits efficient thermal transfer from the workpiece to the support element. In another embodiment, the flexible layer has a preferred thickness in a range of about 2.5 to 250 micrometers and a more preferred thickness in range of about 7.5 to 15 micrometers. Both embodiments are characterized by low particle generation and low particulate contamination of the workpiece.

The surface structure may further include a film on the coating that is selected for compatibility with the workpiece. An optional adhesive layer may be utilized for adhering the flexible layer to the support element.

According to another aspect of the invention, a method is provided for making a surface structure. The method comprises the steps of forming a flexible layer, expanding the flexible layer, applying a coating to the expanded flexible layer and contracting the flexible layer to form ripples in the coating.

The flexible layer may be expanded by heating and may be contracted by cooling. The flexible layer may be formed on a support element before it is heated or may be formed separately from the support element. In another approach, the flexible layer is expanded and contracted mechanically.

In one embodiment, the coating is formed by deposition. In another embodiment, the coating is formed by reaction of the expanded flexible layer with a gas or other reactive material. For example, a silicone layer may react with oxygen to form a silicon dioxide coating.

According to a further aspect of the invention, apparatus is provided for cooling a workpiece in a vacuum processing system. The apparatus comprises a workpiece support element, a surface structure for contacting the workpiece, the surface structure comprising a resilient layer adhered to the support element and a coating on the resilient layer, the coating having ripples on its surface, a device for pressing the workpiece against the surface structure, and a cooling gas system for introducing a gas at a selected pressure between the coating and the workpiece.

According to a further aspect of the invention, apparatus for electrostatic clamping of a workpiece is provided. The apparatus comprises a platen assembly defining a electrically insulating clamping surface for receiving a workpiece, the platen assembly comprising electrodes underlying and electrically isolated from the clamping surface and a dielectric layer between the electrodes and the clamping surface, and a clamping control circuit for applying clamping voltages to the electrodes for electrostatically clamping the workpiece in a fixed position on the clamping surface. The clamping surface is provided with a surface structure, including a flexible layer and a coating having ripples on its surface, as described above.

BRIEF DESCRIPTION OF THE DRAWINGS

For a better understanding of the present invention, reference is made to the accompanying drawings, which are incorporated herein by reference and in which.

DETAILED DESCRIPTION

According to one aspect of the invention, a surface structure for contacting a workpiece is provided. The surface structure exhibits low particle generation and low particulate contamination of the workpiece. Some embodiments of the surface structure are characterized by efficient thermal transfer from the workpiece to a support element.

Figure 1:
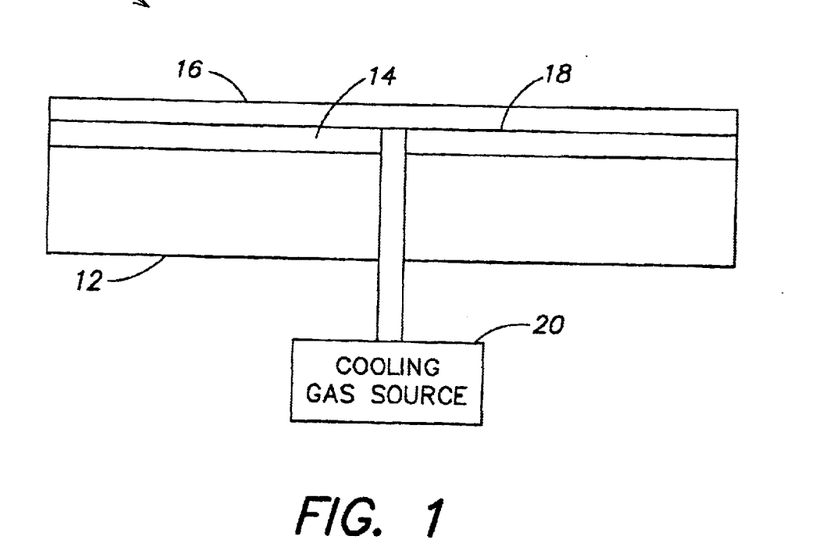
FIG. 1 is a cross-sectional view of a workpiece support device incorporating a first embodiment of a surface structure in accordance with an aspect of the invention.

A workpiece support device 10 in accordance with an embodiment of the invention is shown in FIG. 1. In the embodiment of FIG. 1, a thermal transfer structure constitutes the surface structure. Workpiece support device 10 includes a thermally-conductive support element 12 and a thermal transfer structure 14 having a surface 18. Workpiece 16 is mounted on surface 18 of thermal transfer structure 14. Support element 12 has sufficient mechanical strength to support workpiece 16, while thermal transfer structure 14 is configured to enhance thermal transfer between workpiece 16 and support element 12, as described in detail below. In addition, the thermal transfer structure 14 is characterized by low particle generation and low particulate contamination of the workpiece 16. The workpiece support device 10 shown in FIG. 1 has primary utility in a vacuum environment, but is not limited to such applications.

A cooling gas source 20 may be connected to surface 18 of thermal transfer structure 14 to provide a gas between workpiece 16 and thermal transfer structure 14. The cooling gas may be introduced through a single hole in the workpiece support device 10 or through a multiplicity of holes. In one embodiment, the cooling gas is introduced through a multiplicity of holes arranged in a circular pattern intermediate the center and the outer periphery of support device 10. The cooling gas may be a gas such as air, nitrogen, helium, argon or carbon dioxide, for example, with a pressure typically in the range of about 0.1 to 50 Torr.

In one important application, workpiece 16 is a semiconductor wafer, and workpiece support device 10 is used for supporting semiconductor wafers in a vacuum processing system. For example, workpiece support device 10 may be part of a platen assembly in an ion implantation system. The platen assembly clamps the semiconductor wafer in position during ion implantation and provides cooling of the semiconductor wafer. The platen assembly may utilize mechanical clamping, centrifugal clamping, electrostatic clamping or any other suitable clamping technique for pressing the semiconductor wafer against the thermal transfer structure 14. It will be understood that the workpiece support device 10 is not limited to use in ion implantation systems, is not limited to use with semiconductor wafers and is not limited to use in vacuum. More generally, workpiece support device 10 may be utilized in any application requiring thermal transfer between a workpiece and a support element. In another example, workpiece support device 10 is utilized as the wafer support element of a wafer robot in a semiconductor wafer handling system.

Figure 2:
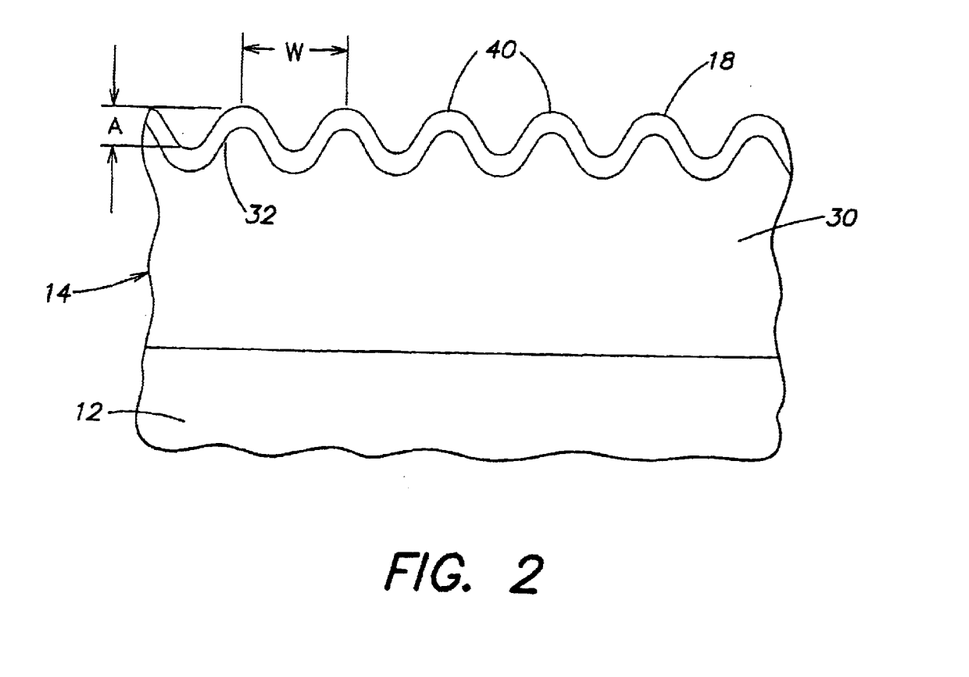
FIG. 2 is an enlarged, partial cross-sectional view of the surface structure of FIG. 1.
Figure 3A:
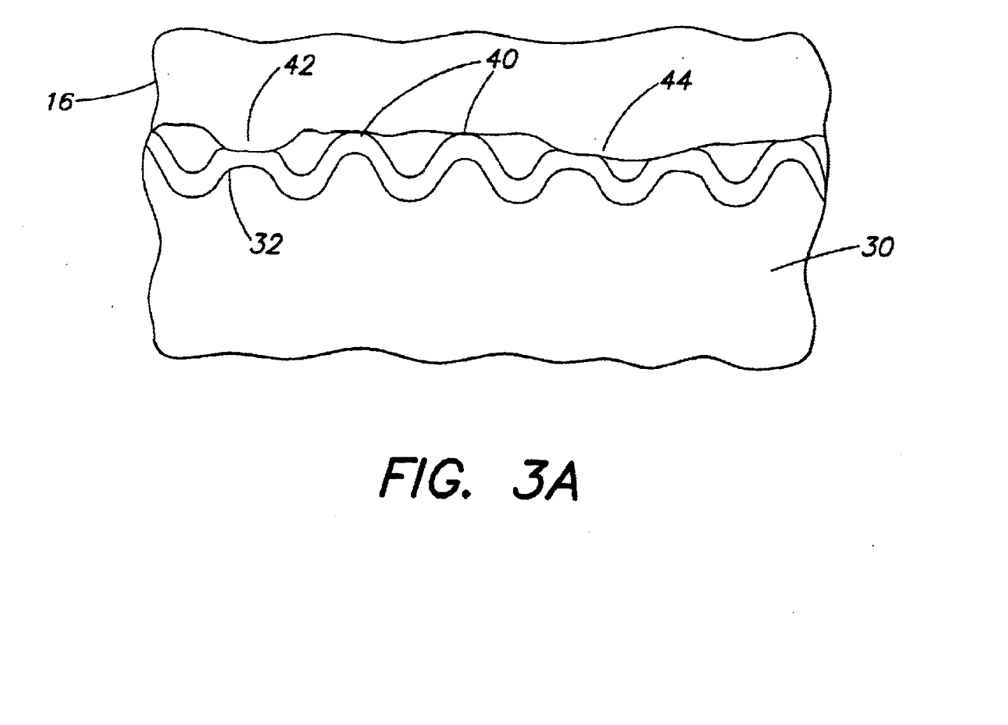
FIG. 3A is an enlarged, partial cross-sectional view of an area of contact between the workpiece and the surface structure.
Figure 3B:
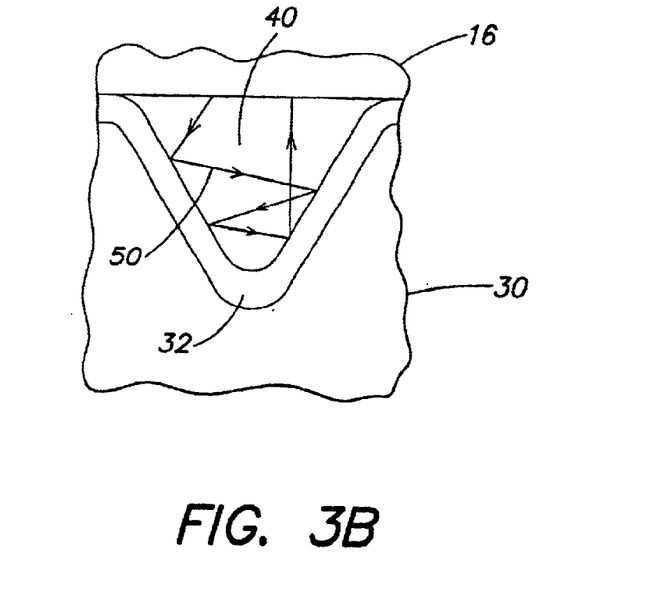
FIG. 3B is a further enlargement of FIG. 3A, that illustrates the enhanced cooling provided by ripples on the surface structure.

An enlarged, partial cross-sectional view of an embodiment of thermal transfer structure 14 is shown in FIGS. 2, 3A and 3B. The thermal transfer structure 14 is enlarged and is not shown to scale in order to facilitate an understanding of the structure and its operation. Thermal transfer structure 14 includes a flexible, resilient, heat-conductive layer 30 affixed to support element 12 and a coating 32 of a chemically inert, low friction material. The coating 32 preferably has good shear strength, good structural integrity and localized hardness. In a preferred embodiment, flexible layer 30 comprises silicone rubber having a thickness in a range of about 5–10 micrometers. Coating 32 may be carbon, silicon nitride or silicon carbonitride, for example. Other possible materials include silicon, metals such as aluminum, aluminum silicate, silicon dioxide and highly crosslinked polymers. Coating 32 may have a thickness in a range of about 0.25–0.50 micrometer. In one embodiment, the coating is formed by deposition. In another embodiment, the coating is formed by reaction of the expanded flexible, heat-conductive layer with a gas or other reactive material. For example, a silicone layer may react with oxygen to form a silicon dioxide coating. It will be understood that the above materials and thicknesses are given by way of example only and are not limiting as to the scope of the present invention.

A further feature of the thermal transfer structure is illustrated in FIG. 2. Ripples 40 are formed on surface 18 of coating 32 as described below. Ripples 40 may have a regular pattern, at least in localized areas, and may be characterized by a wavelength W and an amplitude A. The wavelength W is the center-to-center spacing of the ripples 40 in a direction parallel to the support surface, and the amplitude A is the magnitude of the ripples 40 in a direction perpendicular to the support surface. Preferably, ripples 40 have rounded tops at the areas of contact with the semiconductor wafer or other workpiece to limit particulate generation. For best thermal transfer from the semiconductor wafer to support element 12, the wavelength W of ripples 40 is preferably equal to or less than the mean free path of gas molecules introduced between the wafer and coating 32. For air at a pressure of 10 Torr, the mean free path is approximately 4.7 micrometers. Thus, the wavelength W of ripples 40 should be equal to or less than 4.7 micrometers. In one embodiment, the wavelength W of ripples 40 is about 2 to 3 micrometers. For best thermal transfer, the amplitude A of ripples 40 should be relatively large and is typically of the same order of magnitude as the surface roughness of the back surface of the semiconductor wafer or other workpiece. This permits the coating 32 and flexible layer 30 to conform to the back surface of the semiconductor wafer and enhances thermal transfer as described below. However, the wavelength of the ripples may be greater than the mean free path of the gas when the amplitude of the ripples is equal to or less than the mean free path of the gas.

Figure 3C:
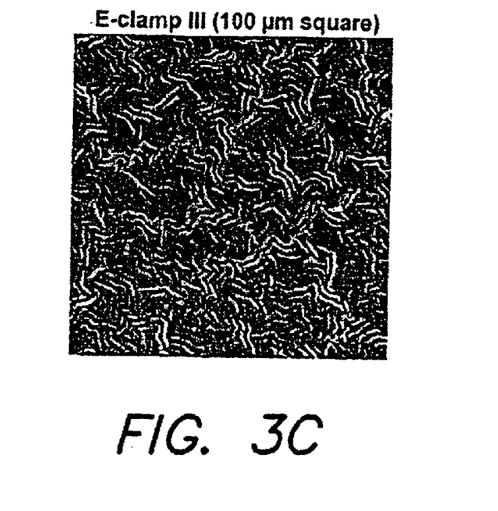
FIG. 3C is a top view of a surface structure having elongated, parallel ripples.
Figure 3D:
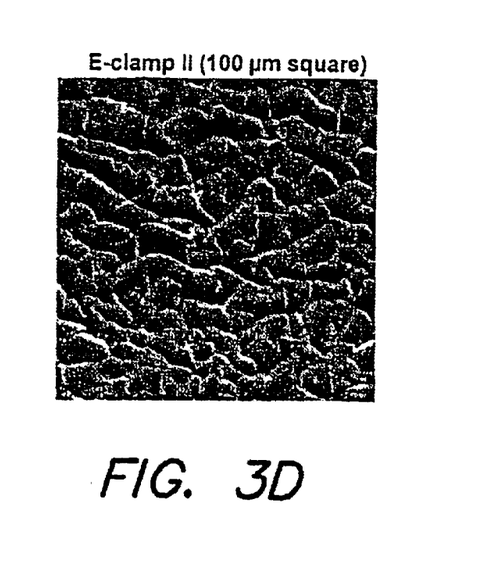
FIG. 3D is a top view of a surface structure having nodular ripples.

The ripples may have any shape and length. In particular, the ripples may be elongated in one dimension, thus defining a series of parallel but not necessarily straight channels, or may be relatively short, thus defining a multiplicity of domes, nodules or bumps on the surface. A top view of a surface having elongated, parallel ripples in localized areas of the surface is shown in FIG. 3C. In FIG. 3C, the ripples have wavelengths of about 2 to 3 micrometers. A top view of a surface having nodular ripples is shown in FIG. 3D.

Enlarged, partial cross-sectional views of the contact area between coating 32 and semiconductor wafer 16 are shown in FIGS. 3A and 3B. The ripples 40 in coating 32 provide highly efficient thermal transfer from wafer 16. One feature of rippled coating 32 is that ripples 40 may be deformed by irregularities in the back surface of wafer 16, thereby increasing the contact area, due to the flexibility of the surface. With reference for example to FIG. 3A, projections 42 and 44 on the back surface of wafer 16 cause adjacent ripples 40 to be deformed, thereby increasing the contact area between the surfaces.

In addition, the ripples 40 on coating 32 provide a larger surface area than the back surface of wafer 16. The difference in areas allows gas molecules to statistically bounce multiple times in the ripples and folds of the heat sink surface, as shown in FIG. 3B. An example of a molecular path 50 is shown. A gas molecule represented by molecular path 50 acquires thermal energy at wafer 16 and then bounces several times in the fold of ripple 40, losing energy each time, before returning to wafer 16. Increasing thermal transfer in this manner by providing ripples 40 is known as raising the accommodation coefficient of the heat sink surface. The accommodation coefficient is defined as the ratio of the temperature difference of the gas molecule after interaction with a surface to the temperature difference before interaction.

The thermal transfer efficiency is increased where a gas molecule bounces several times on the cool surface of coating 32 and loses energy each time before returning to the hot surface of wafer 16, as compared with the case where the gas molecule bounces only once on the surface of coating 32 before returning to wafer 16. Thus, thermal transfer efficiency may be enhanced where the surface area of coating 32 that supports wafer 16 is larger than the back surface area of wafer 16, on a microscopic scale, and the surface irregularities are dimensioned to promote multiple molecular bounces on the cool surface of coating 32.

The thermal transfer structure 14 shown in FIG. 2 and described above has additional advantages. The top inert surface substantially reduces organic contamination of the wafer by the underlying flexible material. Also, the geometry is such that the contact points of the heat sink surface are typically rounded and molecularly smooth, causing a dense, repeatable network of heat conductive contact points that are not sharp enough to generate particles. The overall layer still maintains microscopic flexibility, however, allowing the surface to conform to the wafer geometry, again maximizing contact area.

Figure 4A:
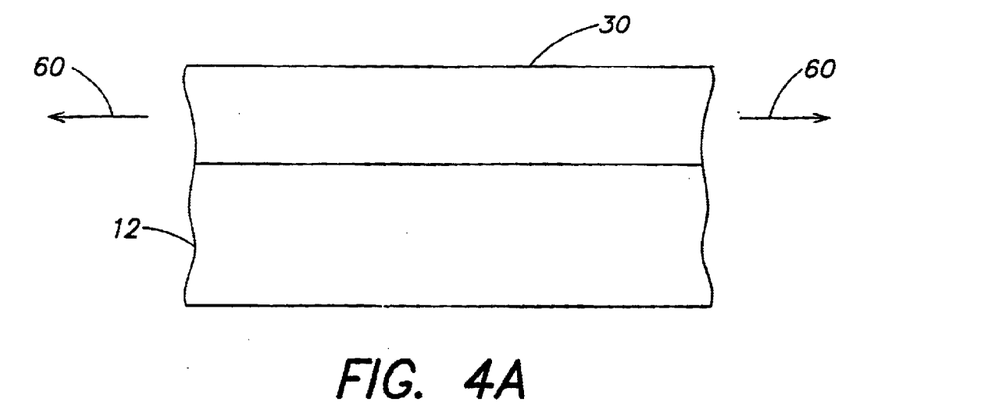
FIGS. 4A–4C schematically illustrate an embodiment of a process for fabricating the surface structure in accordance with another aspect of the invention.

An embodiment of a process for making thermal transfer structure 14 and other surface structures disclosed herein is described with reference to FIGS. 4A–4C. Referring to FIG. 4A, the surface of the support element 12 is prepared by applying an optional bonding agent selected for bonding flexible layer 30 to support element 12. The bonding agent must be chemically compatible with flexible layer 30 and support element 12. In the case of a silicone rubber flexible layer 30, the bonding agent is preferably silicon nitride. The flexible layer, typically silicone, may be sprayed on support element 12 or may be formed by a spin-on process. The flexible layer 30 is then expanded in a direction parallel to the surface of the support element 12, as indicated by arrows 60. Flexible layer 30 is typically expanded by heating. As noted above, flexible layer 30 may be a silicone rubber having a thickness in a range of about 5–10 micrometers, but is not limited to this material and thickness range. The silicone rubber layer may be expanded, by heating to a temperature in a range of about 70° C. to 120° C.

Figure 4B:
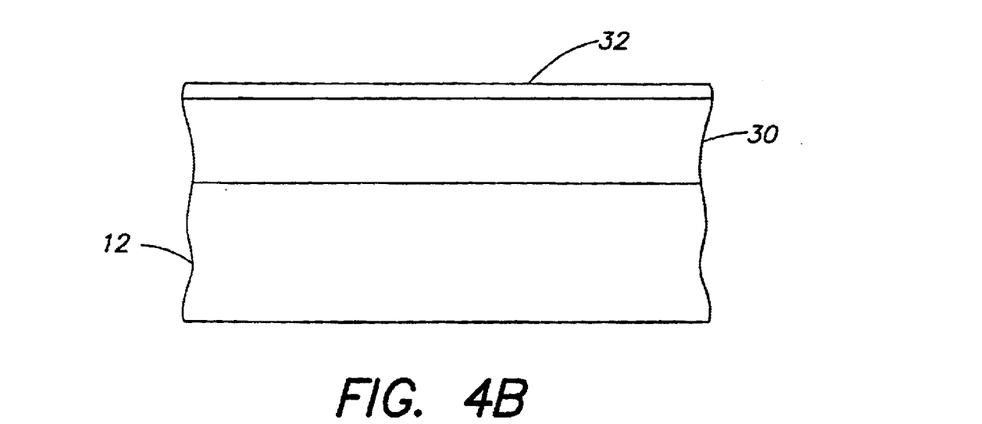

As shown in FIG. 4B, coating 32 is then applied to flexible layer 30 with flexible layer 30 in its expanded state. Coating 32 may be deposited, for example, by plasma enhanced chemical vapor deposition (PECVD) or chemical vapor deposition (CVD). An advantage of this approach is that the flexible layer 30 can be heated to effect expansion in the chamber that is used for depositing coating 32. As noted above, coating 32 is preferably carbon, silicon nitride or silicon carbonitride having a thickness in a range of about 0.25 to 0.5 micrometer, but is not limited to these materials or this thickness range.

In the embodiment described above, coating 32 is formed by deposition. In another embodiment, coating 32 is formed by reaction of the expanded flexible layer 30 with a gas or other reactive material. For example, a silicone rubber flexible layer 30 may react with oxygen to form a silicon dioxide coating. The formation of a silicon dioxide coating on a silicone rubber layer is described in the aforementioned U.S. Pat. No. 4,832,781, which is hereby incorporated by reference.

Figure 4C:
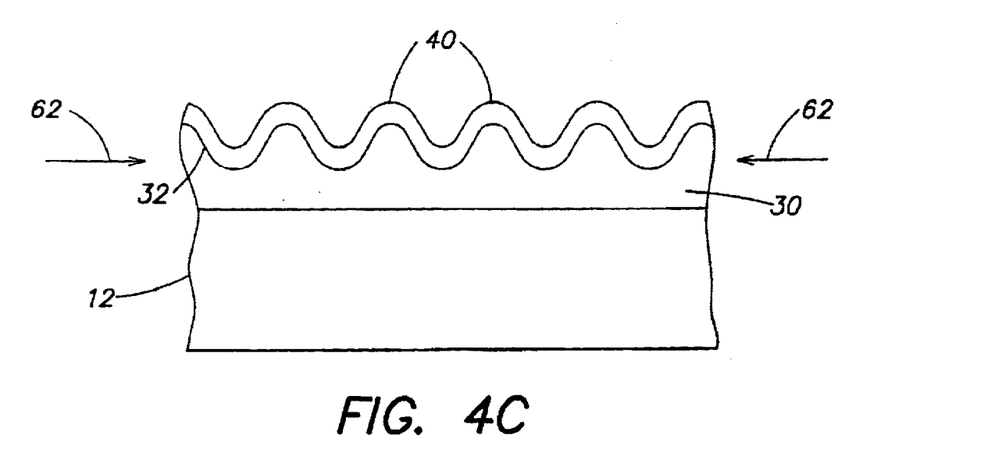

As shown in FIG. 4C, the structure is then cooled, causing flexible layer 30 to contract to its original dimensions, as indicated by arrows 62. The shear resistance of coating 32 causes coating 32 to wrinkle as it cools and to form ripples 40, without delaminating from flexible layer 30. It has been found that this process produces a pattern of ripples 40 across the surface of wafer support element 12. The ripples have reasonably consistent wavelengths and amplitudes.

In the process of FIGS. 4A–4C, flexible layer 30 is applied to support element 12 and then is expanded by heating for deposition of coating 32. In another embodiment, flexible layer 30 can be formed separately from support element 12 and then heated to produce expansion. Coating 32 is applied to the expanded flexible layer, and the flexible layer is cooled to form ripples 40 in coating 32. Flexible layer 30 is then bonded, either chemically or by an adhesive, to the support element 12. In yet another embodiment, the flexible layer 30 is mechanically stretched, without the use of heat, in order to produce the necessary expansion for the application of coating 32.

The coating 32 is not necessarily inorganic or inert. However, for most semiconductor wafer applications this is desirable. Where the thermal transfer structure 14 is utilized on an electrostatic wafer clamp, the coating 32 is necessarily an electrically non-conductive material. However, an electrically non-conductive material is not required where mechanical or centrifugal clamping is used. In those cases, it may be advantageous to use a conductive coating, such as aluminum or tungsten carbide, in order to dissipate electrical charge.

In yet another embodiment, a thin film of a material that is not reactive with the workpiece is applied to the top surface of coating 32. The thin film may have a thickness of a few Angstroms. For example, where coating 32 is silicon nitride and the workpiece is silicon based, a thin film of carbon or silicon carbonitride may be applied to coating 32.

As indicated above, thermal transfer structure 14 maybe utilized in any application which requires thermal transfer from a workpiece to a support structure in vacuum. The thermal transfer structure 14 is particularly useful in electrostatic clamping of semiconductor wafers during ion implantation or other vacuum processing. In an electrostatic wafer clamp, a dielectric layer is positioned between a semiconductor wafer and a conductive support plate. A voltage is applied between the semiconductor wafer and the support plate, and the wafer is clamped against the dielectric layer by electrostatic forces. A variety of electrostatic wafer clamp configurations are known in the art. The electrostatic clamp may have a structure, for example, as disclosed in U.S. Pat. No. 5,452,177 issued Sep. 19, 1995 to Frutiger and in U.S. Pat. No. 5,969,934 issued Oct. 19, 1999 to Larsen, which are hereby incorporated by reference. In such an electrostatic wafer clamp, the thermal transfer structure shown and described herein is affixed to the upper sector insulators to provide enhanced thermal transfer from the semiconductor wafer to the upper sector insulators. However, it will be understood that the thermal transfer structure disclosed herein may be utilized in any electrostatic wafer clamp utilizing any electrode shape.

Figure 5:
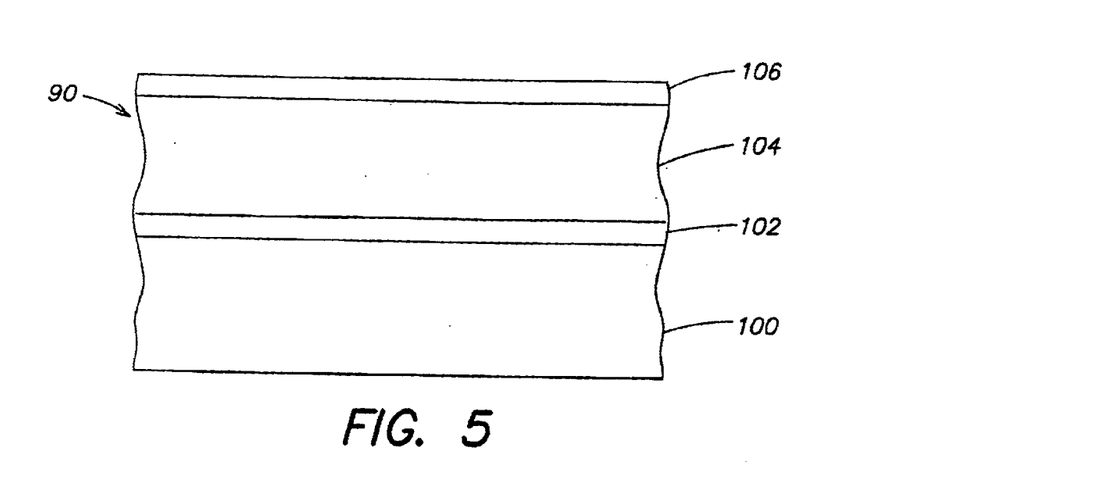
FIG. 5 is a partial cross-sectional view of a second embodiment of a surface structure.

A second embodiment of a surface structure is shown in FIG. 5. The surface structure provides low particle generation low particulate contamination of a workpiece, is resistant to molecular contamination and can be made to have either conducting or insulating electrical properties as needed. The surface has low abrasion properties and is therefore unlikely to cause damage, even on a microscopic scale, to a workpiece. The surface is resistant to external contamination and is relatively durable, and may be cleaned if necessary.

A surface structure 90 includes a workpiece support element 100, which may be made of any material. Examples include electrical and thermal conductors, such as aluminum, and electrical insulators, such as alumina. The surface structure 90 further includes an optional adhesive interface layer 102, a resilient, flexible layer 104 and a coating 106. The support element 100 must be chemically compatible with flexible layer 104 if flexible layer 104 is applied directly to support element 100. When the adhesive interface layer 102 is utilized, support element 100 must be chemically compatible with interface layer 102. Support element 100 may be prepared to accept interface layer 102, or flexible layer 104 if adhesive layer 102 is omitted. Such preparation may involve increasing the microinch surface finish by grinding or lapping, to increase the overall surface area and therefore the bonding adhesion area. The surface of support element 100 should have all protrusions and edges smoothed or chamfered, to provide a continuous surface for the overlying layers. The smoothing step may be omitted if the overlying layers are deposited to sufficient thickness.

Adhesive interface layer 102 is optionally deposited on support element 100. Interface layer 102 may be silicon nitride in the preferred embodiment, but is dependent on the material chosen for flexible layer 104. Interface layer 102 is chemically or plasma deposited onto support element 100 to a thickness of several thousand angstroms. The interface layer 102 acts as an adhesion layer, and thickness is not critical except to provide sufficient material for bonding with flexible layer 104. Other suitable materials for interface layer 102 include, but are not limited to, silicon, carbon, silicon carbide and other materials having chemical compatibility with support element 100 and flexible layer 104.

Flexible layer 104 is initially a polymer layer as deposited. Flexible layer 104 may be sprayed or spun on, while maintaining any critical thickness and/or flatness requirements across the entire surface. The subsequent addition of coating 106 introduces heat that may cause chemical changes in the flexible layer 104, possibly destroying the polymer structures. At that point, the flexible layer 104 can no longer be properly referred to as a polymer. Preferably, flexible layer 104 starts as a silicone rubber (polydimethylsiloxane) having a thickness in a range of about 2.5 to 250 micrometers and, more preferably, having a thickness in a range of about 7.5 to 15 micrometers. The thickness depends on the practical constraints of the application and the practical considerations in depositing the layer. Other polymers which may be used to form flexible layer 104 include, but are not limited to, Teflon, Torlon, Vespel and other polyimides. Flexible layer 104 may be doped or filled with materials such as silicon dioxide to increase thermal and/or electrical conduction. Other filler materials include, but are not limited to, silicon carbide, aluminum nitride and carbon.

Coating 106 may be a plasma deposited, low friction material, such as diamond-like carbon. The deposition is controlled in order to provide adequate but not excessive heat expansion of flexible layer 104 during deposition. Flexible layer 104 may optionally be prepared to receive coating 106 by ion bombardment using an inert gas such as argon. Coating 106 may be deposited to a thickness of several thousand Angstroms, in order to provide a micro-hard, low friction surface for the workpiece to contact, while still allowing macroscopic flexibility of the underlying flexible layer 104. The coating 106 is designed to adhere to flexible layer 102 after deposition, forming a surface with rounded, regular microscopic ripples, after flexible layer 104 has contracted in cooling down after deposition of coating 106. The characteristics of the ripples are described in detail above in connection with coating 32.

The surface structure shown in FIG. 5 and described above provides a low friction, micro-hard contact surface with the ability to absorb heat and vibration. Differential expansion due to workpiece heating and vibration are known to cause particles. Vibration is absorbed as well as refracted and frequency domain shifted by the surface structure. The thermal transfer characteristics depend, at least in part, on the thickness and thermal conductivity of flexible layer 104. Accordingly, where the application requires efficient thermal transfer from the workpiece, a relatively thin flexible layer 104 of relatively high thermal conductivity may be utilized. Conversely, where high efficiency thermal transfer is not a primary requirement, a thicker flexible layer 104 may be utilized.

Figure 6:
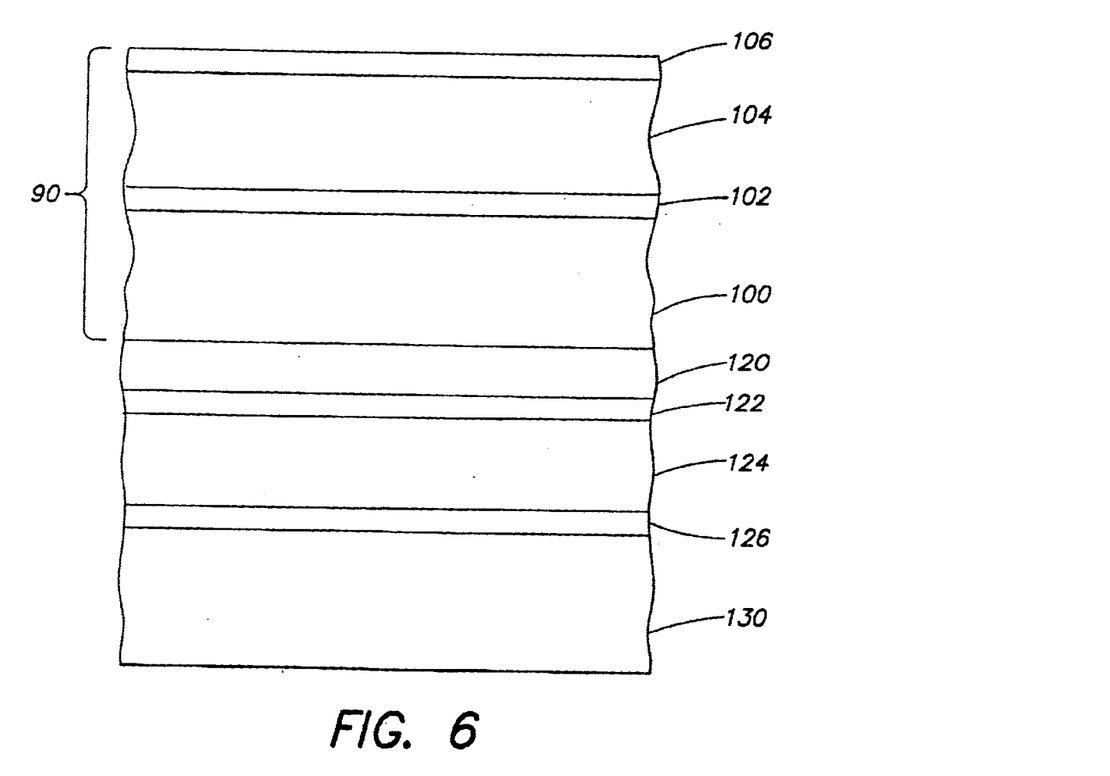
FIG. 6 is a partial cross-sectional view of an electrostatic wafer clamp incorporating the surface structure of FIG. 5.

The application of the surface structure shown in FIG. 5 and described above in an electrostatic wafer clamp is illustrated in FIG. 6. In the embodiment of FIG. 6, support element 100 may be alumina or another ceramic material of suitable dielectric properties for operation of the electrostatic wafer clamp. Support element 100 constitutes the main dielectric of the electrostatic wafer clamp. The thickness of support element 100 is typically from 0.002 to 0.015 inch, with a preferred thickness of 0.005 inch for the preferred alumina material. Other materials may require different thicknesses based on dielectric constants. An electrode layer 120 may be molybdenum/titanium or niobium, or another metallic or electrically conductive material. The electrode layer 120 is typically several thousand angstroms in thickness, but may have a greater thickness. In any case, a minimum conductivity must be maintained. An adhesive layer 122 is used to bond support element 100 and electrode layer 120 to an underlying insulating layer 124. Adhesive layer 122 may be FEP Teflon.

Insulating layer 124, which may be alumina, may have a thickness of 0.100 inch. However, the thickness of insulating layer 124 is not critical, provided that the electrode layer 120 is electrically insulated from any other electrically conductive material, such as base 130. The insulating layer 124 must be thick enough to prevent significant capacitive coupling to any nearby conductive material other than the semiconductor wafer.

An adhesive layer 126 adheres insulating layer 124 and the overlying layers to the base 130. Adhesive layer 126 may optionally be filled with silicon dioxide or other material to improve thermal conductivity to base 130.

Base 130, preferably aluminum, may be water cooled to absorb the heat load from the semiconductor wafer. Therefore, base 130 must be made of a thermally conductive material, but may optionally be made from an electrical insulator such as aluminum nitride or other thermally conductive material, regardless of electrical conductivity.

The surface structures described above may utilize a beveled peripheral edge as described in the aforementioned U.S. Pat. No. 5,969,934. Alternatively, the beveled edge may be omitted if, in the construction of the wafer clamp or other workpiece support device, the flexible layer can be made to wrap around the edges or taper to an edge. This depends on the technique used for forming the flexible layer. Furthermore, if the total thickness of the flexible layer and the coating is greater than an expected edge feature height above the support element, then the beveled peripheral edge may be omitted, since the workpiece will not be allowed to contact any hard abrasive features normally present on the support element.

An example of apparatus for electrostatic clamping of a workpiece, such as a semiconductor wafer, is shown in simplified form in FIGS. 7–10. An electrostatic wafer clamping apparatus includes a platen 210 and a clamping control circuit 212 for applying clamping voltages to the platen 210 when clamping of a workpiece is desired. The platen 210 includes a support plate, or a platen base 214, and six sector assemblies 220, 222, 224, 226, 228 and 230 mounted on an upper surface of platen base 214. The platen base 214 is generally circular and may have a central opening 218 for a wafer lift mechanism (not shown).

Figure 7:
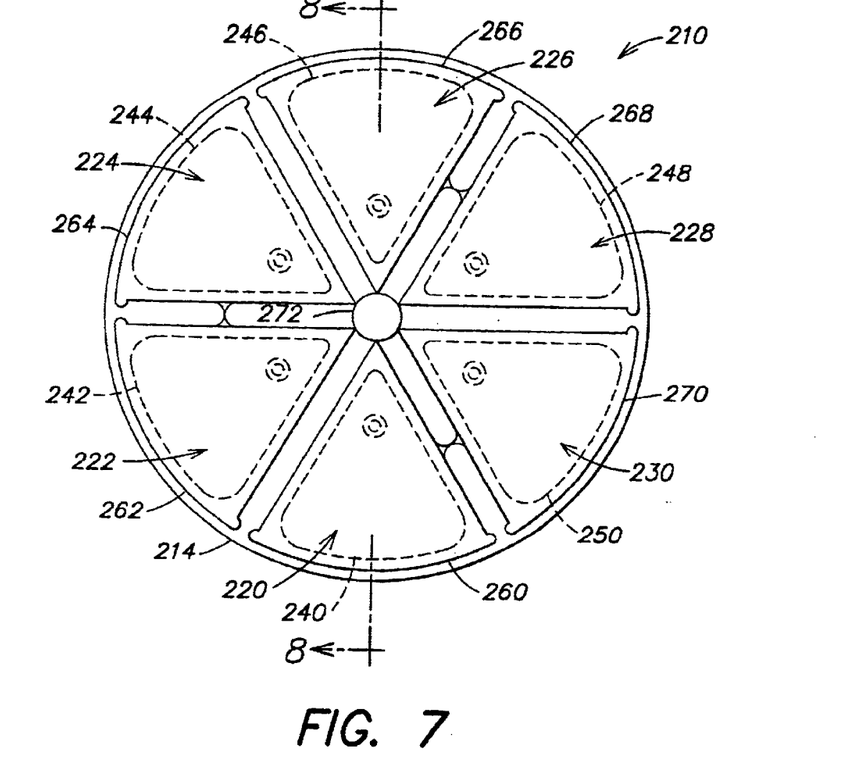
FIG. 7 is a schematic plan view of an example of electrostatic wafer clamping apparatus in accordance with a further aspect of the invention.
Figure 8:
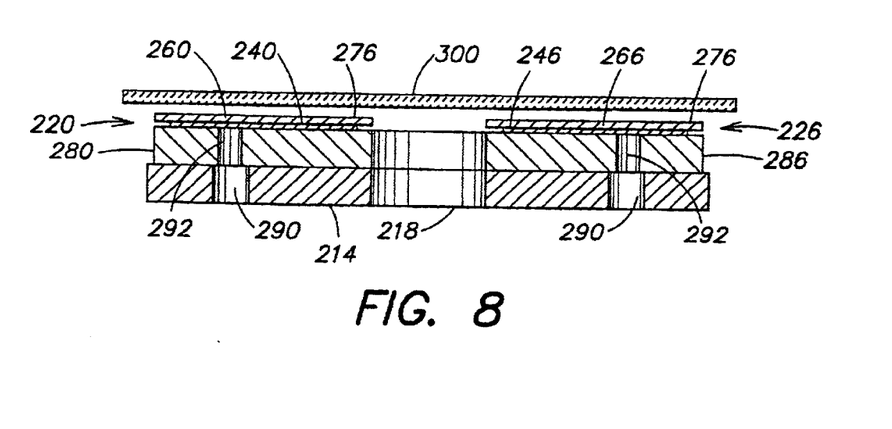
FIG. 8 is a schematic cross-sectional view of the wafer clamping apparatus, taken along the line 2—2 of FIG. 7.

Each of the sector assemblies includes a sector electrode located between an upper sector insulator and a lower sector insulator. Sector assemblies 220, 222, 224, 226, 228 and 230 include sector electrodes 240, 242, 244, 246, 248 and 250, respectively. Upper sector insulators 260, 262, 264, 266, 268 and 270 cover electrodes 240, 242, 244, 246, 248 and 250, respectively. The electrodes are preferably thin metal layers formed on the lower surfaces of the respective upper sector insulators. The electrodes 240, 242, 244, 246, 248 and 250 preferably have equal areas and are symmetrically disposed with respect to a center 272 of platen 210. The electrodes are electrically isolated from each other and, in a preferred embodiment, are sector-shaped as shown in FIG. 7. The upper surfaces of sector insulators 260, 262, 264, 266, 268 and 270 are coplanar. A surface structure, as described above, covers the upper sector insulators and defines a wafer clamping surface 276. As shown in FIG. 8, sector assembly 220 includes a lower sector insulator 280 and sector assembly 226 includes a lower sector insulator 286. The remaining sector assemblies have the same construction. Preferably, the upper and lower sector insulators of each sector assembly overlap the edges of the respective electrodes to prevent contact between the electrodes and the wafer.

In the embodiment of FIGS. 7–10, a separate sector assembly including sector-shaped upper and lower sector insulators, is fabricated for each electrode. In other embodiments, the upper insulator or the lower insulator, or both, may be formed as a circular disk. Multiple electrodes may be formed on the lower surface of the circular upper insulator. This configuration may be practical for relatively small platens.

The platen base 214 and the lower sector insulators 280, 286, etc., are provided with aligned openings 290 and 292, respectively, underlying each of the electrodes. The openings 290 and 292 permit electrical connection to each of the electrodes. A semiconductor wafer 300 is shown in FIG. 3 positioned above clamping surface 276. When clamping voltages are applied to electrodes 240, 242, 244, 246, 248 and 250, the wafer 300 is electrostatically clamped in a fixed position against clamping surface 276.

The upper sector insulators 260, 262, 264, 266, 268 and 270 are preferably a hard ceramic material that has high dielectric strength and high permitivity, and does not exhibit bulk polarization at the frequency and voltage used for clamping. Preferred materials include alumina, sapphire, silicon carbide and aluminum nitride. The upper sector insulators may, for example, have a thickness in a range of about 100 to 200 micrometers to permit reliable clamping with a voltage having a peak amplitude of about 1,000 volts. The upper surfaces of the upper sector insulators are ground flat to within 25 micrometers.

The electrodes 240, 242, 244, 246, 248 and 250 are preferably formed by depositing metal layers on the lower surfaces of the respective upper sector insulators 260, 262, 264, 266, 268 and 270. In a preferred embodiment, the electrodes comprise a conductive coating of niobium. The thickness of each electrode is typically on the order of about one micrometer. Other suitable conductive metal layers may be used within the scope of the invention. For example, titanium-molybdenum electrodes are described in the aforementioned U.S. Pat. No. 5,452,177.

The lower sector insulators have sufficient thickness to provide structural rigidity and to electrically isolate the electrodes. The lower sector insulators are preferably fabricated of the same or a similar material as the upper sector insulators for matching of thermal expansion coefficients. In a preferred embodiment, the lower sector insulators are fabricated of alumina. The platen base 214 is typically fabricated of a metal such as aluminum.

Each upper sector insulator having an electrode formed on its lower surface is bonded to the upper surface of the lower sector insulator, preferably using a thermoplastic tetrafluoroethylene adhesive 308 (FIG. 10), such as Teflon FEP bonding material.

The clamping voltages applied to the electrodes of platen 210 are preferably bipolar square waves having six different phases (0°, 60°, 120°, 180°, 240° and 300°). The phases of the voltages applied to electrodes on opposite sides of platen 210 are one-half cycle, or 180°, out of phase. Thus, the voltages applied to electrodes 240 and 246 are one-half cycle out of phase; the voltages applied to electrodes 242 and 248 are one-half cycle out of phase; and the voltages applied to electrodes 244 and 250 are one-half cycle out of phase. The disclosed clamping apparatus provides reliable clamping and unclamping of wafers without requiring electrical contact to the wafer and without producing charging currents which could potentially damage the wafer.

Figure 9:
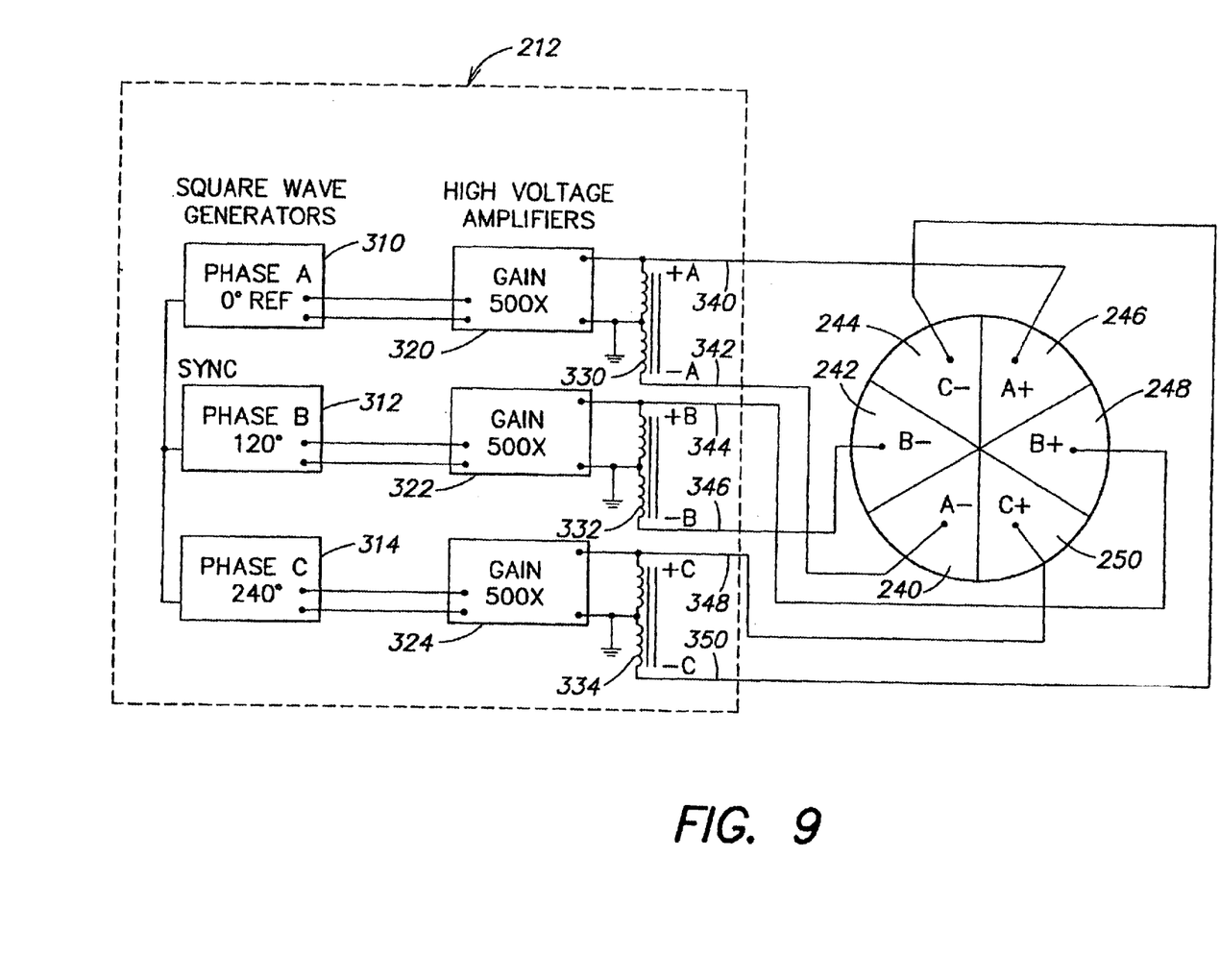
FIG. 9 is a schematic block diagram of the electrostatic wafer clamping apparatus, showing an example of a clamping control circuit.

An example of a suitable clamping control circuit 212 is shown in FIG. 9. Square wave generators 310, 312 and 314 supply low voltage square waves to amplifiers 320, 322 and 324, respectively. The outputs of amplifiers 320, 322 and 324 are applied to high voltage inverter transformers 330, 332 and 334, respectively. The transformers 330, 332 and 334 produce output voltages that are 180°, or one-half cycle, out of phase. The outputs of transformer 330 on lines 340 and 342 are bipolar square waves that are one-half cycle out of phase. The outputs on lines 340 and 342 are connected to electrodes 246 and 240, respectively. The outputs of transformer 330 on lines 344 and 346 are bipolar square waves that are one-half cycle out of phase and are shifted by 120° relative to the outputs of transformer 330. The outputs of transformer 332 on lines 344 and 346 are connected to electrodes 248 and 242, respectively. The outputs of transformer 334 on lines 348 and 350 are one-half cycle out of phase and are shifted by 240° relative to the outputs of transformer 330. The outputs of transformer 334 on lines 348 and 350 are connected to electrodes 250 and 244, respectively. This configuration provides six phase clamping of the wafer. Additional details regarding the clamping control circuit and the clamping voltages are provided in the aforementioned U.S. Pat. No. 4,452,177, which is hereby incorporated by reference.

Figure 10:
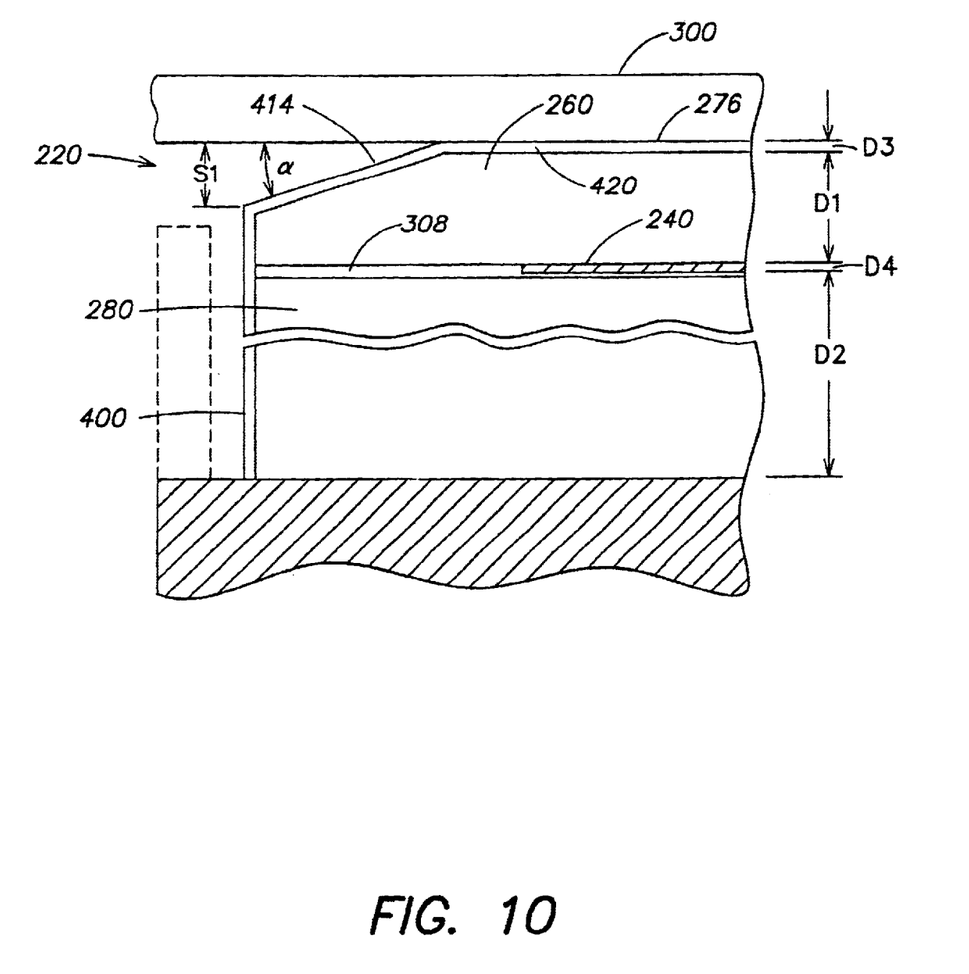
FIG. 10 is a partial cross-sectional view of an example of an implementation of the electrostatic wafer clamping apparatus.

A partial cross-sectional view of an example of an implementation of the electrostatic wafer clamp of the invention is shown in FIG. 10. Like elements in FIGS. 7, 8 and 10 have the same reference numerals. A portion of sector assembly 220 is shown. It will be understood that FIG. 10 is not drawn to scale in order to facilitate an understanding of the present invention. As indicated, electrode 240 is positioned between upper sector insulator 260 and lower sector insulator 280. Sector insulators 260 and 280 are secured together with adhesive 308. Electrode 240 is preferably spaced from a side 400 of sector assembly 220. In a preferred embodiment, electrode 240 is spaced from side 400 by about 0.1 inch. A surface structure 420 on the upper sector insulator 260 corresponds to surface structure 14 shown in FIGS. 1–3D, surface structure 90 shown in FIGS. 5 and 6 or any other surface structure within the scope of the present invention. As described above, a periphery of upper sector insulator 260 may be beveled to define a beveled surface 414.

In another embodiment, the upper sector insulators are eliminated and the surface structure is applied directly to the electrodes. An optional adhesive may be used to adhere the flexible layer of the surface structure to the electrodes. In this case, the flexible layer serves as the dielectric of the electrostatic wafer clamp. Therefore, the flexible layer must have sufficient thickness to withstand the operating voltage of the clamp. In yet another embodiment, the lower sector insulators may be an insulating coating or sheet, which may be a polymer or a ceramic material.

As noted above, the surface structures disclosed herein may be utilized in any electrostatic wafer clamp. Another suitable electrostatic wafer clamp is disclosed in WO 96/13058, published May 2, 1996, which is hereby incorporated by reference. The disclosed wafer clamp employs gas cooling and has spiral shaped electrodes.

The surface structures disclosed herein have been described in connection with use in electrostatic wafer clamps. The surface structures may be utilized in other types of wafer clamps, such as those which utilize mechanical clamping or centrifical clamping. In addition, the surface structure may be utilized for end effectors, gripper pads, and conveyance surfaces such as those required for the handling of materials and objects such as semiconductor wafers, optical glass parts, medical equipment, electronic components, space industry components or any objects requiring low contamination or clean room environments. The surface structure can also be used as a protection against minor accidental collisions with the underlying support element, in order to avoid generation of contaminating particles.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for cooling a workpiece in a vacuum processing system, comprising:
 a workpiece support element;
 a surface structure for contacting the workpiece, said surface structure comprising a resilient layer adhered to the support element and a coating on the resilient layer, said coating having ripples on its surface;
 a device for pressing the workpiece against the surface structure; and
 a cooling gas system for introducing a gas at a selected pressure between said coating and the workpiece.

2. Apparatus as defined in claim 1 wherein the ripples on said coating have a localized regular pattern and substantially cover the portion of the surface structure that contacts the workpiece.

3. Apparatus as defined in claim 1 wherein said ripples comprise elongated, parallel ripples in localized areas of the coating.

4. Apparatus as defined in claim 1 wherein said ripples comprise microminiature nodules.

5. Apparatus as defined in claim 1 wherein said ripples have wavelengths parallel to said surface that are less than or equal to the mean free path of the gas at said selected pressure.

6. Apparatus as defined in claim 1 wherein said ripples have amplitudes perpendicular to said surface that are equal to or less than the mean free path of the gas at said selected pressure.

7. Apparatus as defined in claim 1 wherein said ripples are rounded at areas of contact with the workpiece.

8. Apparatus as defined in claim 1 wherein said ripples have wavelengths parallel to said surface on the order of a few micrometers.

9. Apparatus as defined in claim 1 wherein said resilient layer has a thickness in a range of about 5 to 10 micrometers.

10. Apparatus as defined in claim 1 wherein said resilient layer has a thickness in a range of about 2.5 to 250 micrometers.

11. Apparatus as defined in claim 1 wherein said resilient layer has a thickness in a range of about 7.5 to 15 micrometers.

12. Apparatus as defined in claim 1 wherein said resilient layer comprises a polymer layer.

13. Apparatus as defined in claim 1 wherein said resilient layer comprises silicone rubber.

14. Apparatus as defined in claim 1 wherein said coating has a thickness in a range of about 0.25 to 0.50 micrometers.

15. Apparatus as defined in claim 1 wherein said coating is selected from a group consisting of silicon nitride, silicon carbo-nitride and carbon.

16. Apparatus as defined in claim 1 wherein said coating comprises silicon dioxide.

17. Apparatus as defined in claim 1 wherein said surface structure is configured for contacting a semiconductor wafer.

18. Apparatus as defined in claim 1 wherein said surface structure further comprises a film on said coating that is selected for compatibility with the workpiece.

19. Apparatus as defined in claim 1 wherein said surface structure further comprises an adhesive interface layer between the resilient layer and the support element.

20. Apparatus for electrostatic clamping of a workpiece, comprising:

a platen assembly defining an electrically insulating clamping surface for receiving a workpiece, the platen assembly comprising electrodes underlying and electrically isolated from said clamping surface, a dielectric layer between the electrodes and the clamping surface, and a surface structure defining the clamping surface, said surface structure comprising a resilient layer adhered to said dielectric layer and a coating having ripples on its surface; and a clamping control circuit for applying clamping voltages to the electrodes for electrostatically clamping the workpiece in a fixed position on the clamping surface.

21. Apparatus as defined in claim 20 wherein said resilient layer is thermally conductive.

22. Apparatus as defined in claim 20 wherein said ripples form a regular pattern, at least in localized areas of the surface, and wherein said ripples cover substantially the entire area of said clamping surface.

23. Apparatus as defined in claim 20 further comprising a cooling has system for introducing a gas at a selected pressure between said coating and the workpiece.

24. Apparatus as defined in claim 23 wherein said ripples have amplitudes perpendicular to said surface that are less than or equal to the mean free path of the cooling gas at said selected pressure.

25. Apparatus as defined in claim 23 wherein said ripples have amplitudes perpendicular to said surface that are less than or equal to the mean free path of the cooling gas at said selected pressure.

26. Apparatus as defined in claim 20 wherein said resilient layer has a thickness in a range of about 5 to 10 micrometers.

27. Apparatus as defined in claim 20 wherein said resilient layer comprises silicone rubber.

28. Apparatus as defined in claim 20 wherein said coating has a thickness in a range of about 0.25 to 0.50 micrometers.

29. Apparatus as defined in claim 20 wherein said coating is selected from the group consisting of silicon nitride, silicon carbo-nitride and carbon.

30. Apparatus as defined in claim 20 wherein said coating comprises silicon dioxide.

31. Apparatus as defined in claim 20 wherein said platen assembly is configured for clamping a semiconductor wafer.

32. Apparatus as defined in claim 20 wherein said resilient layer has a thickness in a range of about 2.5 to 250 micrometers.

33. Apparatus as defined in claim 20 wherein said resilient layer has a thickness in a range of about 7.5 to 15 micrometers.

34. Apparatus as defined in claim 20 wherein said resilient layer comprises a polymer layer.

35. Apparatus as defined in claim 20 wherein said surface structure further comprises a film on said coating that is selected for compatibility with the workpiece.

36. Apparatus as defined in claim 20 wherein said surface structure further comprises an adhesive interface layer between said resilient layer and said dielectric layer.

* * * * *